(12) United States Patent
Lee

(10) Patent No.: US 9,153,639 B2
(45) Date of Patent: Oct. 6, 2015

(54) MEMORY DEVICES WITH VERTICAL STORAGE NODE BRACING AND METHODS OF FABRICATING THE SAME

(71) Applicant: Samsung Electronics Co., Ltd., Suwon-si (KR)

(72) Inventor: Junghwan Lee, Suwon-Si (KR)

(73) Assignee: Samsung Electronics Co., Ltd. (KR)

( * ) Notice: Subject to any disclaimer, the term of this patent is extended or adjusted under 35 U.S.C. 154(b) by 139 days.

(21) Appl. No.: 13/764,243

(22) Filed: Feb. 11, 2013

(65) Prior Publication Data

US 2013/0249053 A1     Sep. 26, 2013

(30) Foreign Application Priority Data

Mar. 23, 2012    (KR) ........................ 10-2012-0029979

(51) Int. Cl.
    *H01L 49/02*     (2006.01)
    *H01L 27/08*     (2006.01)
    *H01L 27/108*     (2006.01)

(52) U.S. Cl.
    CPC ............ *H01L 28/40* (2013.01); *H01L 27/0805* (2013.01); *H01L 27/10808* (2013.01); *H01L 27/10852* (2013.01); *H01L 28/91* (2013.01)

(58) Field of Classification Search
    CPC .............. H01L 28/40; H01L 27/10582; H01L 27/10808; H01L 27/085; H01L 28/91; H01L 27/10817; H01L 27/10852
    USPC ................. 257/532, 330, 298, 296, 334, 300, 257/E29.343
    See application file for complete search history.

(56) References Cited

U.S. PATENT DOCUMENTS

| 6,381,165 | B1 | 4/2002 | Lee et al. |
| 7,655,968 | B2 | 2/2010 | Manning |
| 8,912,629 | B2* | 12/2014 | Seo ............................... 257/532 |
| 2006/0211178 | A1 | 9/2006 | Kim et al. |
| 2009/0206448 | A1 | 8/2009 | Cho et al. |
| 2010/0024179 | A1 | 2/2010 | Xie et al. |
| 2010/0193853 | A1 | 8/2010 | Busch et al. |
| 2010/0240179 | A1 | 9/2010 | Kim et al. |
| 2010/0240191 | A1 | 9/2010 | Chung et al. |
| 2011/0156206 | A1 | 6/2011 | Jie |

FOREIGN PATENT DOCUMENTS

| KR | 1020080012536 A | 2/2008 |
| KR | 1020090044569 A | 5/2009 |
| KR | 1020090068775 A | 6/2009 |
| KR | 1020090105152 A | 10/2009 |
| KR | 1020110078020 A | 7/2011 |

\* cited by examiner

*Primary Examiner* — Kenneth Parker
*Assistant Examiner* — Bo Fan
(74) *Attorney, Agent, or Firm* — Myers Bigel Sibley & Sajovec, P.A.

(57) ABSTRACT

A memory device includes a substrate and a plurality of vertical storage nodes linearly spaced apart on the substrate along a first direction. The device further includes at least one support pattern abutting sidewalls of the storage nodes, the at least one support pattern having portions that bridge first pairs of adjacent ones of the storage nodes and openings therein that separate second pairs of adjacent ones of the storage nodes. First distances between the storage nodes of the respective first pairs may be greater than second distances between the storage nodes of the respective second pairs. Methods of fabricating such devices are also described.

16 Claims, 15 Drawing Sheets

MEMORY DEVICES WITH VERTICAL STORAGE NODE BRACING AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2012-0029979, filed on Mar. 23, 2012, in the Korean Intellectual Property Office, the entire contents of which are hereby incorporated by reference.

BACKGROUND OF THE INVENTION

Some embodiments of the inventive subject matter relate generally to a semiconductor memory devices and methods of fabricating the same and, more particularly, semiconductor memory devices including capacitors and methods of fabricating the same.

To meet a growing demand for lightweight, small, high-speed, multifunctional, high-performance, high-reliable, and low-cost electronic devices, it is desirable that semiconductor memory devices have a high integration density and reliability. Increasing capacitance of capacitors used as memory elements may be considered to improve the reliability of a semiconductor memory device using such capacitors. For example, the capacitance of a capacitor can be increased by increasing an aspect ratio of a capacitor lower electrode. For this reason, there have been ongoing efforts to increase an aspect ratio of a capacitor lower electrode.

SUMMARY

Some embodiments of the inventive subject matter may provide semiconductor memory devices with improved reliability. According to some example embodiments of the inventive subject matter, a memory device includes a substrate and a plurality of vertical storage nodes linearly spaced apart on the substrate along a first direction. The device further includes at least one support pattern abutting sidewalls of the storage nodes, the at least one support pattern having portions that bridge first pairs of adjacent ones of the storage nodes and openings therein that separate second pairs of adjacent ones of the storage nodes. First distances between the storage nodes of the respective first pairs may be greater than second distances between the storage nodes of the respective second pairs.

In some embodiments, the at least one support pattern may include a plurality of parallel elongate strips extending along a second direction transverse to the first direction. In some embodiments, the at least one support pattern may include a mesh and the openings may include openings spaced apart along a second direction transverse to the first direction.

In some embodiments, the at least one support pattern may include a first support pattern positioned at a first height above the substrate and a second support pattern positioned at a second height above the substrate. A top surface of the second support pattern may be coplanar with top surfaces of the storage nodes.

In some embodiments, the device may further include a capacitor dielectric surrounding the storage nodes and an electrode layer covering the storage nodes and the capacitor dielectric. The storage nodes may be cylindrical.

Further embodiments of the inventive subject matter provide a memory device including a substrate and a plurality of vertical capacitors linearly spaced apart on the substrate along a first direction. The device further includes at least one support pattern abutting sidewalls of the vertical capacitors, the at least one support pattern having portions that bridge first pairs of adjacent ones of the vertical capacitors and openings therein that separate second pairs of adjacent ones of the vertical capacitors. Each of the vertical capacitors may include a cup-shaped lower electrode having a base portion and wall portions that define an inner volume, a dielectric layer conforming to an inner wall of the lower electrode and an upper electrode extending into the inner volume defined by the lower electrode and separated by the lower electrode by the dielectric layer. First distances between the lower electrodes of the respective first adjacent pairs may be greater than second distances between the lower electrodes of the respective second adjacent pairs. The at least one support pattern may abuts outer walls of the lower electrodes.

Further embodiments provide methods of fabricating a memory device. At least one mold layer is formed on a substrate. At least one support layer is formed in or on the mold layer. Vertical storage nodes are formed that extend to the substrate through the at least one support pattern and the at least one mold layer. A dielectric layer conforming to inner surfaces of the storage nodes is formed. The at least one mold layer is removed to leave at least one support pattern abutting sidewalls of the storage nodes, the at least one support pattern having portions that bridge first pairs of adjacent ones of the storage nodes and openings therein that separate second pairs of adjacent ones of the storage nodes. An electrode layer is formed having portions that extend into volumes defined by the storage nodes and that are separated from the storage nodes by the dielectric layer. First distances between the storage nodes of the respective first pairs may be greater than second distances between the storage nodes of the respective second pairs.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
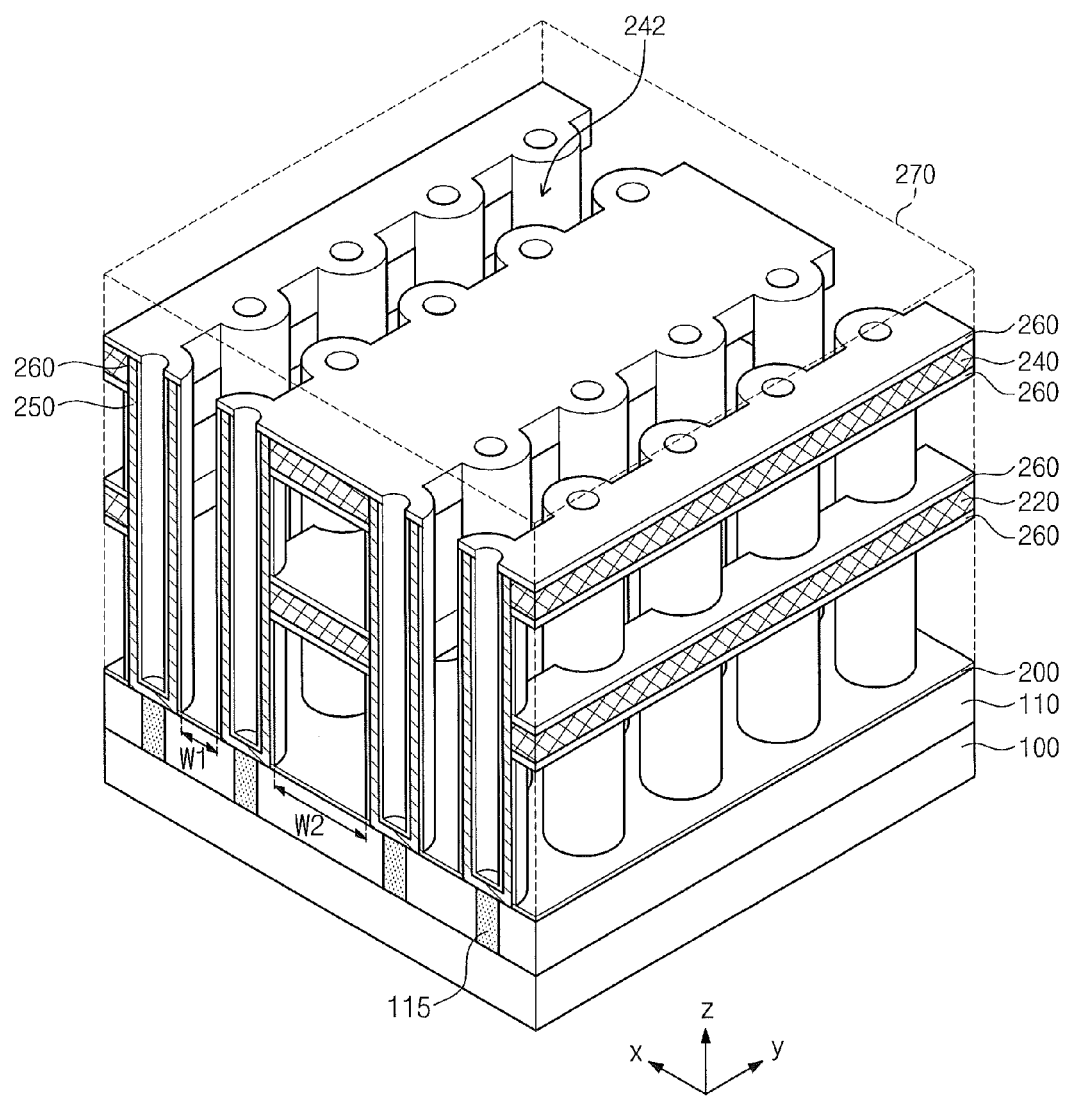
FIG. 1A is a perspective view illustrating a semiconductor memory device according to some example embodiments of the inventive subject matter.

It should be noted that these figures are intended to illustrate the general characteristics of methods, structure and/or materials utilized in certain some example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive subject matter will now be described more fully with reference to the accompanying drawings, in which example embodiments are shown. Example embodiments of the inventive subject matter may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive subject matter are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive subject matter should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive subject matter belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
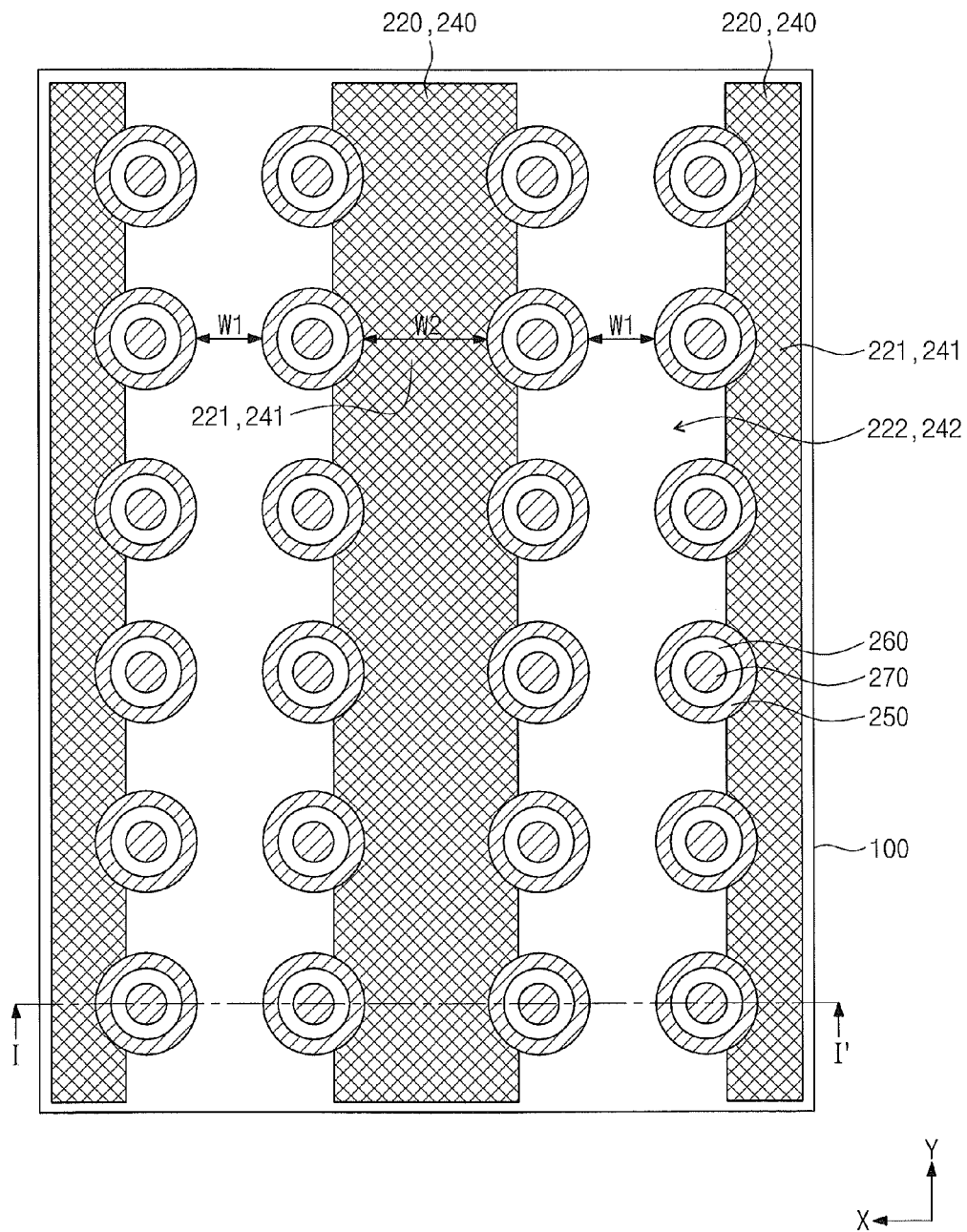
FIG. 1B is a top plan view of FIG. 1A.

FIG. 1A is a perspective view illustrating a semiconductor memory device according to some example embodiments of the inventive subject matter. FIG. 1B is a top plan view of FIG. 1A, and FIG. 1C is a sectional view taken along a line I-I' of FIG. 1B.

Figure 1C:
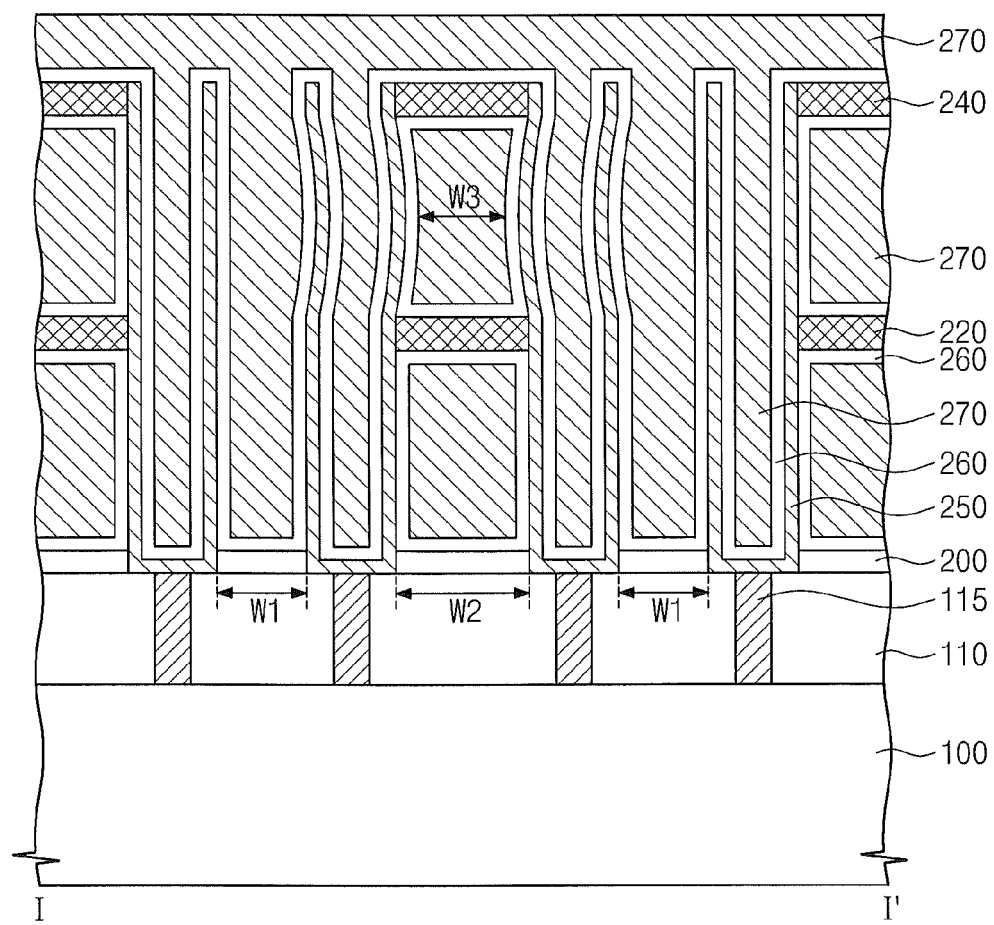
FIG. 1C is a sectional view taken along a line I-I' of FIG. 1B.

Referring to FIGS. 1A through 1C, an interlayer dielectric 110 may be provided on a substrate 100. The substrate 100 may be a semiconductor substrate, for example, a silicon substrate, a germanium substrate, a silicon-germanium substrate, and so forth. The interlayer dielectric 110 may include a dielectric material such as an oxide, a nitride and/or an oxynitride.

Contact plugs 115 may be provided on the substrate 100 to penetrate the interlayer dielectric 110. The contact plugs 115 may include semiconductor materials (e.g., polysilicon), metal-semiconductor compounds (e.g., tungsten silicide), conductive metal nitrides (e.g., titanium nitride, tantalum nitride or tungsten nitride), and/or metals (e.g., titanium, tungsten, or tantalum).

A plurality of word lines and a plurality of bit lines that cross one another may be provided on the substrate 100, and the interlayer dielectric 110 may cover the word lines and the bit lines. Doped regions may be provided in the substrate 100 on both sides of each word lines, and each of the contact plugs 115 may be connected to the corresponding one of the doped regions.

On the interlayer dielectric 110, storage nodes 250 of vertical capacitors may be provided. The storage nodes 250 may have a longitudinal axis perpendicular to a top surface of the substrate 100 (i.e., along z-direction). Respective ones of the storage nodes 250 may be electrically connected to corresponding ones of the contact plugs 115. In some example embodiments, bottom surfaces of respective ones of the storage nodes 250 may be in contact with top surfaces of the contact plugs 115.

In some example embodiments, the storage nodes 250 may have a cylindrical structure, but embodiments of the inventive subject matter are not limited thereto. For example, the storage nodes 250 may have, for example, a pillar-shaped structure or a hybrid cylindrical structure including both of pillar-shaped and cylindrical portions. For purposes of illustration, the description that follows will refer to embodiments in which the storage nodes 250 have the cylindrical structure as shown.

The storage nodes 250 may include a plate portion having a bottom surface parallel to the substrate 100 and a sidewall portion upward extending from an edge of the plate portion such that the storage nodes 250 have a cup-like shape that defines an inner volume. The bottom surface of the plate portion of the storage node 250 may be in contact with the top surface of the contact plug 115.

The storage nodes 250 may include a conductive material. For example, the storage nodes 250 may include a doped semiconductor, a conductive metal nitride (e.g., titanium nitride, tantalum nitride, or tungsten nitride), a metal (e.g., ruthenium, iridium, titanium, or tantalum), and/or a conductive metal oxide (e.g., iridium oxide).

An etch stop layer 200 may be further provided on the interlayer dielectric 110. The storage nodes 250 may contact the top surfaces of the contact plugs 115 through the etch stop layer 200. In some example embodiments, the semiconductor memory device may not include the etch stop layer 200.

An upper electrode layer 270 may be formed on the interlayer dielectric 110, covering the storage nodes 250. The upper electrode layer 270 may include a doped semiconductor, a conductive metal nitride (e.g., titanium nitride, tantalum nitride, or tungsten nitride), a metal (e.g., ruthenium, iridium, titanium, or tantalum), and/or a conductive metal oxide (e.g., iridium oxide).

First and second support patterns 220 and 240 may be provided on the interlayer dielectric 110. Each of the first and second support patterns 220 and 240 may be in partial contact with sidewalls of the storage nodes 250, thereby supporting the storage nodes 250. The first and second support patterns 220 and 240 may be disposed in the upper electrode layer 270.

For example, the first support pattern 220 may be disposed at an intermediate level of the storage nodes 250 to support the storage nodes 250, while the second support pattern 240 may be disposed to have a top surface coplanar with top surfaces of the storage nodes 250. The vertical positions of the first and second support patterns 220 and 240 may not be limited thereto. In addition, the semiconductor memory device may be configured not to have one of the first and second support patterns 220 and 240, or to include an additional support pattern, but embodiments of the inventive subject matter may not be limited thereto.

In some example embodiments, as shown in FIG. 1B, the second support pattern 240 may have a plurality of openings 242 defined therein. Each of the openings 242 may partially expose sidewalls of the storage nodes 250. For example, each of the openings 242 may extend along y direction and expose two adjacent columns of the storage nodes 250 arranged along y direction. In other words, each of the openings 242 may expose two storage nodes 250 in x direction and a plurality of the storage nodes 250 in y direction.

Bridges 241 may delimit the openings 242. For example, the bridges 241 may be spaced apart from each other, in x direction, by the openings 242 extending along the second direction. In some example embodiments, from plan view, the bridges 241 and the openings 242 may have a long rectangular shape, but embodiments of the inventive subject matter are not limited thereto. The first support pattern 220 may include a plurality of bridges 221 and having a plurality of openings 222 defined therein. In some example embodiments, the first support pattern 220 may have the same shape as the second support pattern 240.

The storage nodes 250 may be spaced apart from each other on the substrate 100 along both x and y directions, i.e., two-dimensionally. For example, the storage nodes 250 may be arranged to form a plurality of rows in x direction and a plurality of columns in y direction. The storage nodes 250 constituting the rows and columns may be linearly disposed in x and y directions, respectively.

For a specific column of the storage nodes 250, distances to two other columns adjacent thereto may be different from each other. For example, a second interval w2 between the storage nodes 250 separated by a bridge 241 may be greater than a first interval w1 between the storage nodes 250 facing each other at an opening 242. In other words, the second interval w2 between the storage nodes 250 facing each other at the bridges 221 and 241 may be greater than the first interval w1 of the storage nodes 250 facing each other at the openings 222 and 242.

A capacitor dielectric 260 may be disposed between the storage nodes 250 and the upper electrode layer 270 and between the first and second support patterns 220 and 240 and the upper electrode layer 270. The capacitor dielectric 260 may be formed to cover exposed surfaces of the storage nodes 250, exposed surfaces of the first and second support patterns 220 and 240, and a top surface of the interlayer dielectric 110. The capacitor dielectric 260 may include an oxide (e.g., silicon oxide), a nitride (e.g., silicon nitride), an oxynitride (e.g., silicon oxynitride), and/or a high-k dielectric (e.g., hafnium oxide).

According to some example embodiments of the inventive subject matter, the storage nodes 250 may be spaced apart from each other with two different intervals. Due to this disposition of the storage nodes 250, it is possible to reduce leaning of the storage nodes 250 from forces applied during subsequent processes. This may reduce the likelihood and extent of leakage current. For example, the storage nodes 250 may be prone to bending toward the bridges 221 and 241, and this may lead to an increase in leakage current between adjacent ones of the storage nodes 250. However, if the second interval w2 is greater than the first interval w1, these problems may be reduced, as will be described in more detail below.

Figure 4:
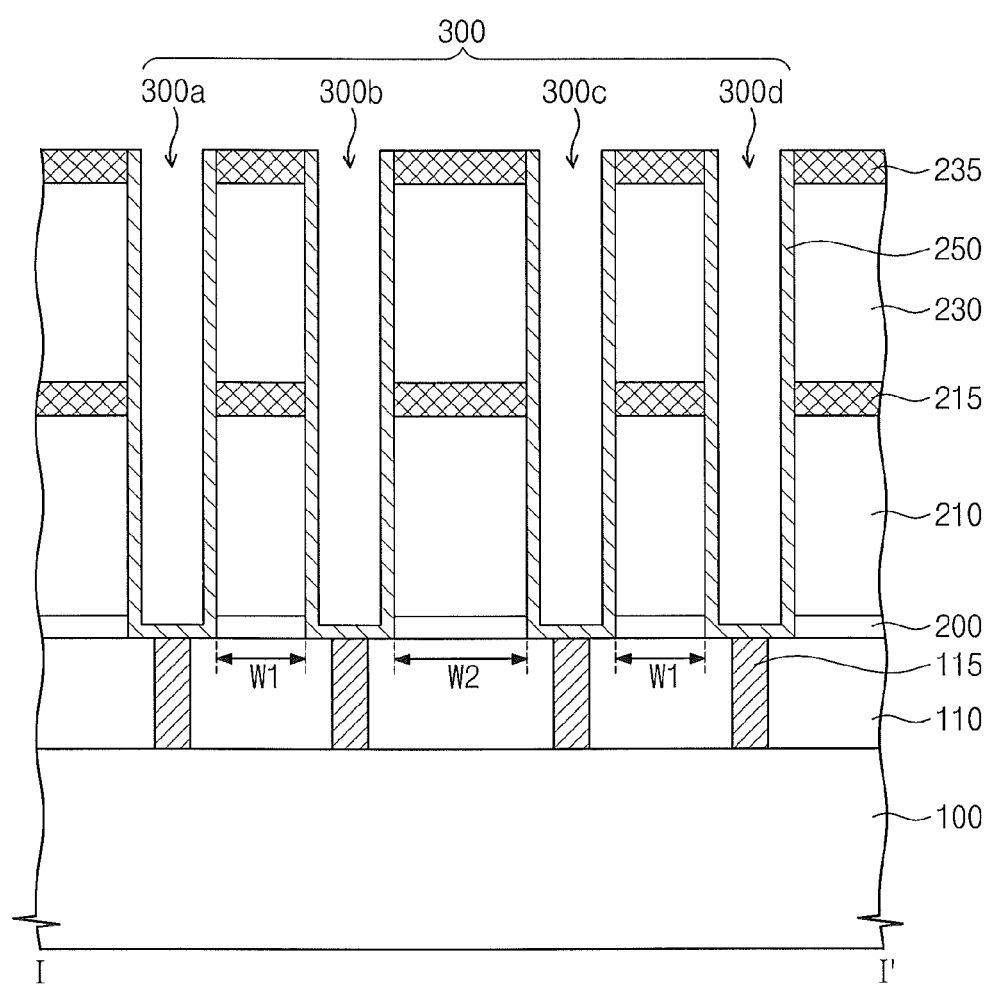
Figure 5:
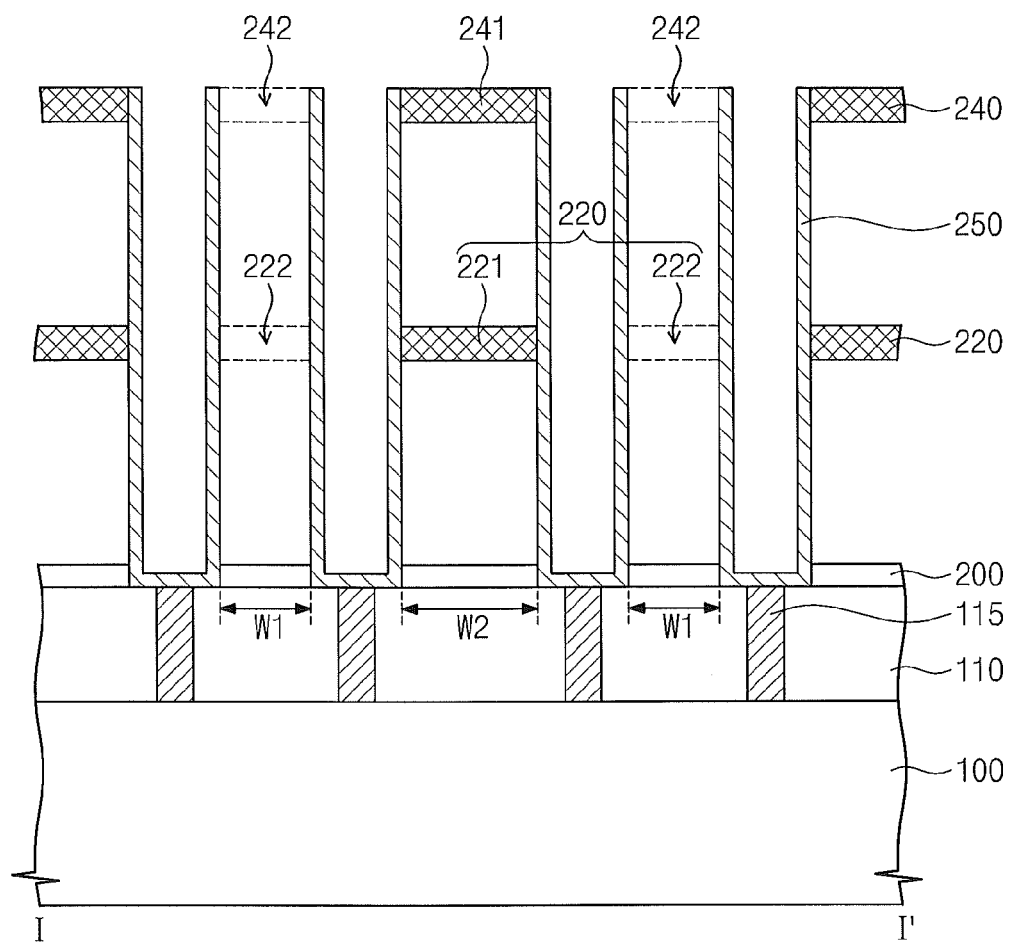
Figure 6:
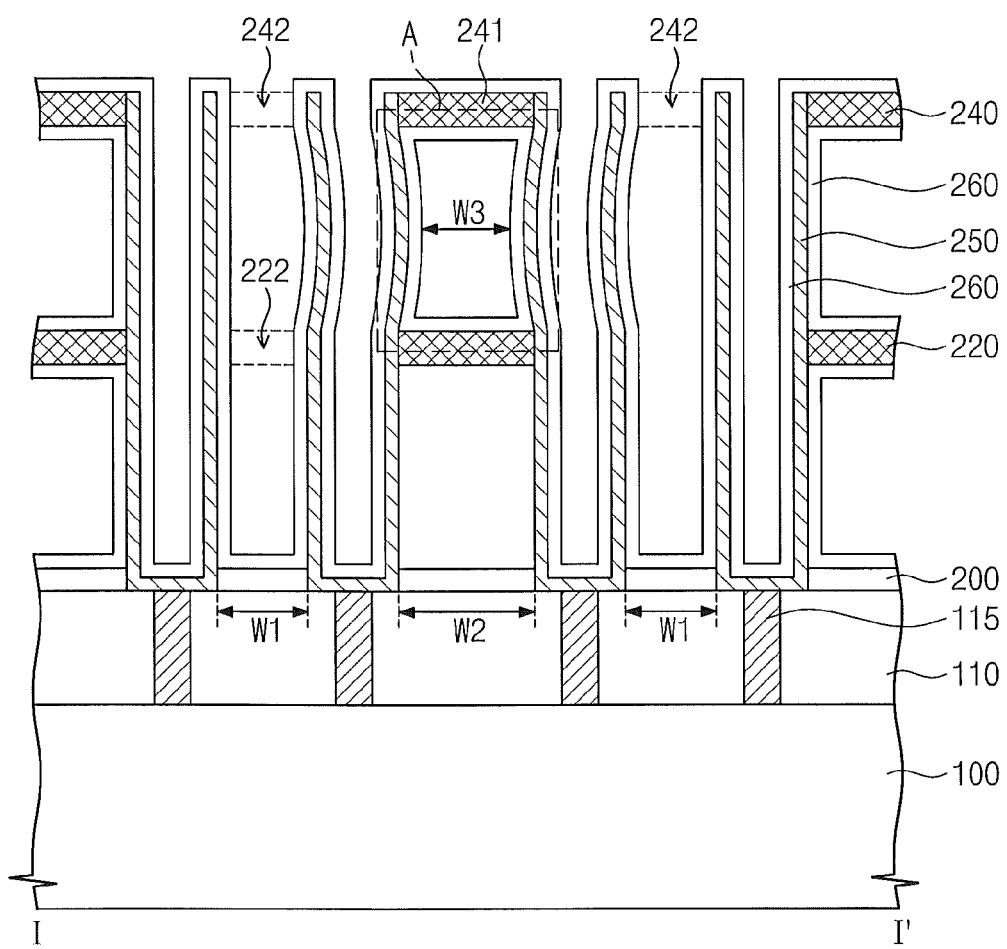
Figure 7A:
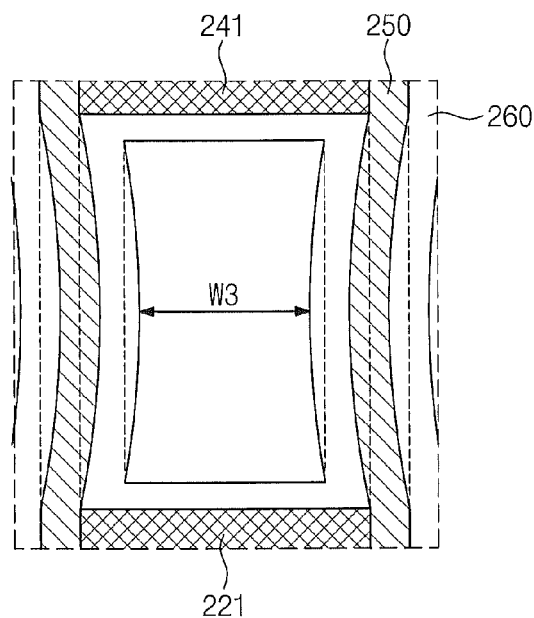
FIG. 7A is an enlarged sectional view of a portion A of FIG. 6.
Figure 7B:
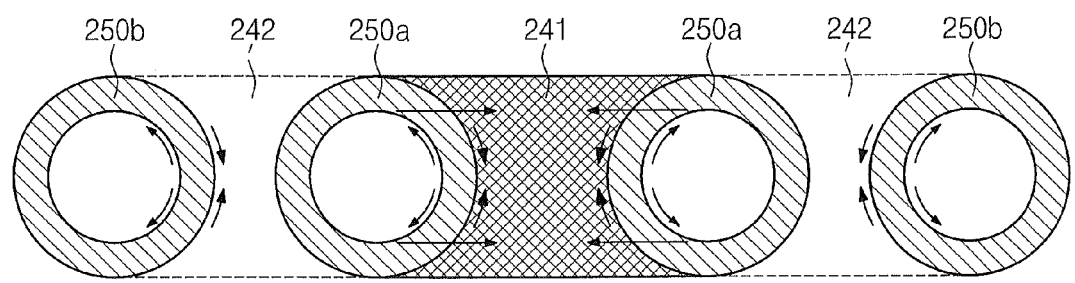
FIG. 7B is a top plan view illustrating storage nodes of FIG. 6.

FIGS. 2 through 6 and 8 are sectional views illustrating operations for fabricating a semiconductor memory device according to some example embodiments of the inventive subject matter. FIG. 7A is an enlarged sectional view of a portion A of FIG. 6, and FIG. 7B is a top plan view illustrating a portion of the semiconductor memory device of FIG. 6.

Figure 2:
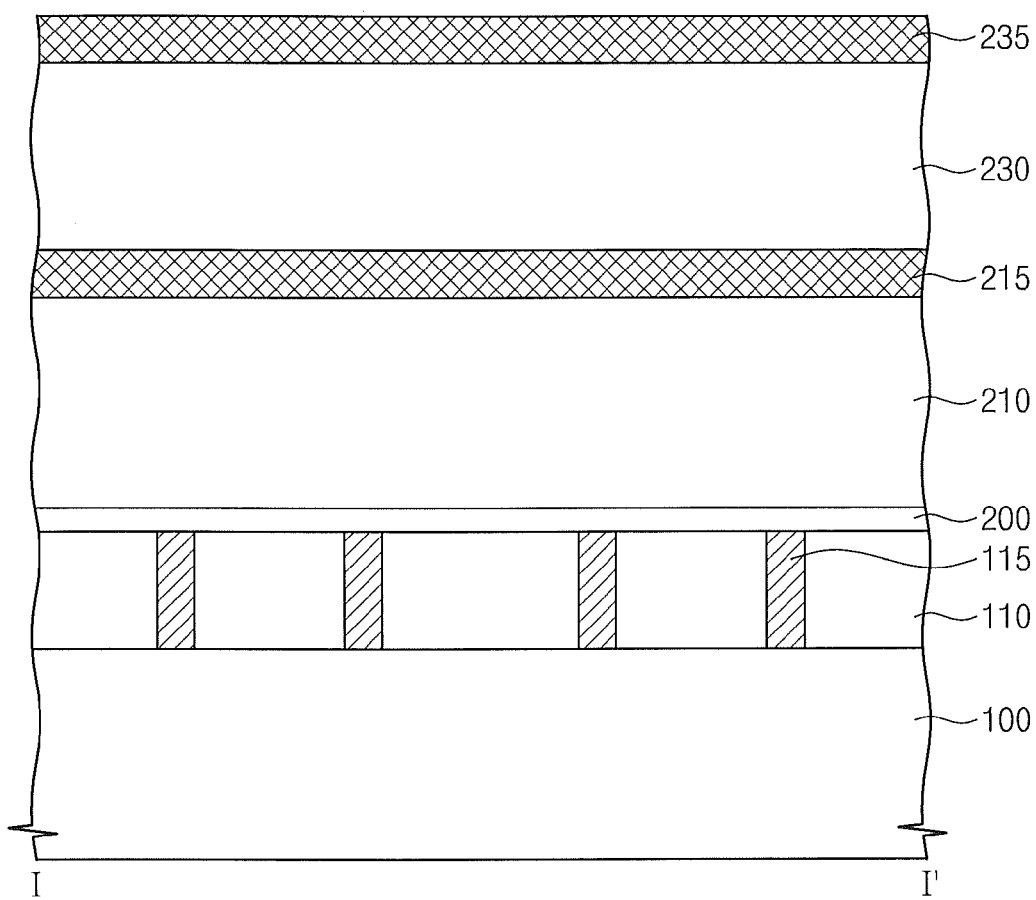
FIGS. 2 through 6 and 8 are sectional views illustrating a method of fabricating a semiconductor memory device according to some example embodiments of the inventive subject matter.

Referring to FIG. 2, the interlayer dielectric 110 may be formed on the substrate 100. The substrate 100 may include a semiconductor material. For example, the substrate 100 may include at least one of a silicon substrate, a silicon-germanium substrate, and/or a germanium substrate. The interlayer dielectric 110 may include a dielectric material such as an oxide, a nitride, and/or an oxynitride.

The contact plugs 115 may be formed on the substrate 100 to penetrate the interlayer dielectric 110. The formation of the contact plugs 115 may include forming a contact hole in the interlayer dielectric 110 to expose a portion of the substrate 100, and then filling the contact hole with a conductive material. The contact plug 115 may include a semiconductor materials (e.g., polysilicon), metal-semiconductor compounds (e.g., tungsten silicide), conductive metal nitrides (e.g., titanium nitride, tantalum nitride or tungsten nitride) and/or a metals (e.g., titanium, tungsten, or tantalum).

A plurality of word lines and a plurality of bit lines that cross one another may be formed on the substrate 100 and the interlayer dielectric 110 may be formed to cover the word lines and the bit lines. Doped regions may be formed in the substrate 100 on both sides of each word line, and the contact plugs 115 may be connected to corresponding ones of the doped regions.

The etch stop layer 200, a first molding layer 210, a first support layer 215, a second molding layer 230, and a second support layer 235 may be sequentially formed on the substrate 100. The etch stop layer 200 may be, for example, a silicon nitride layer. In some example embodiments, the formation of the etch stop layer 200 may be omitted. The first and second molding layers 210 and 230 may include, for example, silicon oxide layers. The first and second support layers 215 and 235 may include silicon nitride layers or germanium oxide layers.

Figure 3:
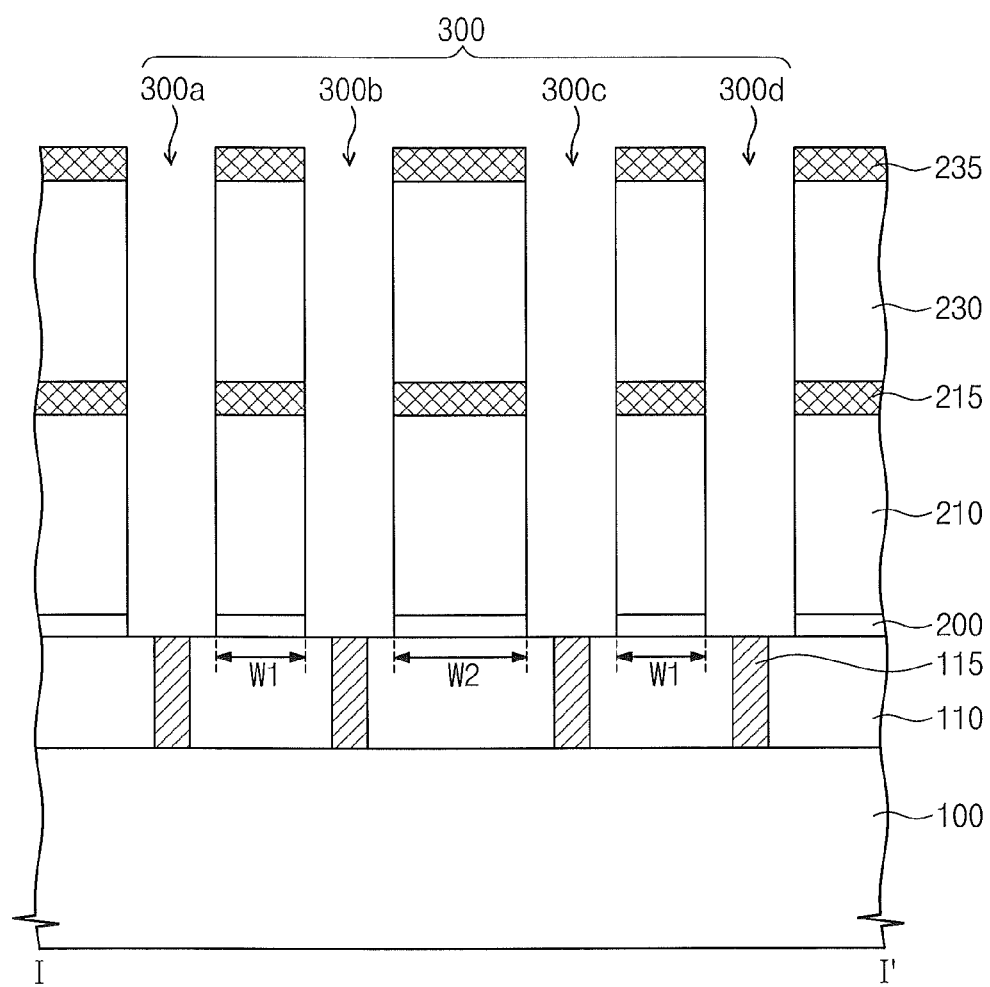

Referring to FIG. 3, holes 300 may be formed through the second support layer 235, the second mold layer 230, the first support layer 215, the first mold layer 210, and the etch stop layer 200. The holes 300 may be formed spaced apart from each other on the substrate 100.

In some example embodiments, the holes 300 may be formed using at least two different intervals in x direction. For example, x-directional intervals between the holes 300 may include a first interval w1 and a second interval w2 that are different from each other. As exemplarily shown in FIG. 3, the holes 300 may include first, second, third, and fourth holes 300a, 300b, 300c, and 300d, which are formed along x direction, and in this case, the first and second holes 300a and 300b may be formed to have the first interval w1, the second and third holes 300b and 300c may be formed to have the second interval w2, which may be greater than the first interval w1. Furthermore, the third and fourth holes 300c and 300d may be formed to have the first interval w1.

The formation of the holes 300 may include forming a photo mask on the second support layer 235, sequentially etching the second support layer 235, the second molding layer 230, the first support layer 215, and the first molding layer 210 using the same as an etch mask to expose the etch stop layer 200, and etching the etch stop layer 200 to expose top surfaces of the contact plugs 115.

In some example embodiments, the second support layer 235, the second mold layer 230, the first support layer 215, the first molding layer 210, and the etch stop layer 200 may be etched in the same and single reaction chamber to form the holes 300. Alternatively, at least two of the second support layer 235, the second mold layer 230, the first support layer 215, the first molding layer 210, and the etch stop layer 200 may be etched in different reaction chambers to form the holes 300. Embodiments of the inventive subject matter may not be limited to the above example. For example, a structure of the hole 300 may be variously modified.

Referring to FIG. 4, the storage nodes 250 may be formed in the holes 300. As described in FIG. 3, the holes 300 may be formed to have the first and second intervals w1 and w2 different from each other, and thus, the storage nodes 250 filling the holes 300 may be disposed to have the first interval w1 and the second interval w2.

The formation of the storage nodes 250 may include depositing a lower electrode layer to cover inner surfaces of the holes 300, forming a sacrificial layer in the holes 300 provided with the lower electrode layer, and then, performing a planarization process to the structure provided with the sacrificial layer to expose a top surface of the second support layer 235. The planarization process may be performed using a chemical-mechanical polishing technique. In some example embodiments, the sacrificial layer may be formed of the same material as at least one of the first and second mold layers 210 and 230.

The storage nodes 250 may be formed by a physical vapor deposition and/or a chemical vapor deposition. The storage nodes 250 may include doped semiconductors, conductive metal nitrides (e.g., titanium nitride, tantalum nitride, and/or tungsten nitride), a metals (e.g., ruthenium, iridium, titanium, and/or tantalum), and conductive metal oxides (e.g., iridium oxide).

The storage nodes 250 provided in the holes 300 may be electrically connected to respective corresponding ones of the contact plugs 115. The storage nodes 250 may be localized in the holes 300 such that they may be spaced apart from each other.

Referring to FIG. 5, the first and second support layers 215 and 235 may be patterned to form first and second support patterns 220 and 240, respectively. As shown in FIG. 1B, openings 242 may be formed in the second support pattern 240 by etching a portion of the second support layer 235. The second support pattern 240 may include bridges 241, which may be a remaining portion of the second support layer 235 (except for the openings 242). Similar to the second support pattern 240, openings 222 may be formed in the first support pattern 220 by etching a portion of the first support layer 215. The first support pattern 220 may include bridges 221, which may be a remaining portion of the first support layer 215 (except for the openings 222). Each of the openings 222 and 242 may be formed to expose partially the sidewalls of the storage nodes 250. For example, the storage nodes 250 may be formed to have sidewalls exposed by the openings 222 and 242.

The sacrificial layer, the first mold layer 210, and the second mold layer 230 may be removed. The removal process may include supplying an etchant through the openings (222 and 242) in the first and second support patterns 220 and 240. As the result of the removal of the first mold layer 210 and the second mold layer 230, sidewalls of the storage nodes 250 and a surface of the first support pattern 220 may be exposed.

In some embodiments, the sacrificial layer and the first and second mold layers 210 and 230 may be removed by an etching process using a solution containing ammonium fluoride ($NH_4F$) and hydrofluoric acid (HF) as an etchant. The sacrificial layer and the first and second mold layers 210 and 230 may be removed by a single etching process or by several etching processes designed to selectively etch the sacrificial layer and the first and second mold layers 210 and 230. In some embodiments, a process of removing a by-product or remaining substance may be further performed, after the exposure of the first and second support pattern 220 and 240.

Referring to FIG. 6, a capacitor dielectric 260 may be formed on the resulting structure including the exposed first and second support patterns 220 and 240. In some embodiments, the capacitor dielectric 260 may conform to exposed surfaces of the storage nodes 250, the first and second support patterns 220 and 240, and/or the etch stop layer 200. The capacitor dielectric 260 may include an oxide (e.g., silicon oxide), a nitride (e.g., silicon nitride), an oxynitride (e.g., silicon oxynitride), and/or a high-k dielectric (e.g., hafnium oxide). Due to the presence of the capacitor dielectric 260, the storage nodes 250 can be electrically separated from a subsequently formed upper electrode layer. The storage nodes 250 and the upper electrode layer can serve as electrodes of capacitors.

During the process of fabricating the semiconductor device, some of the storage nodes 250 may be deformed or lean, as shown in FIG. 6. For example, upper regions of the storage nodes 250 facing each other with the bridges 241 interposed therebetween may bend toward the bridges 241. As the result of this bending, the storage nodes 250 facing each other with the bridges 241 interposed therebetween be separated by a third interval w3 that is less than the second interval w2. Lower regions of the storage nodes 250 facing each other with the bridges 221 interposed therebetween may also bend toward the bridges 221.

FIG. 7A is an enlarged sectional view of the portion A of FIG. 6, and FIG. 7B is a top plan view illustrating the storage nodes of FIG. 6. Referring to FIG. 7A, the storage nodes 250 facing each other with the first and bridges 221 and 241 interposed therebetween may be concavely deformed toward one another. As the result of the concave deformation, an interval between the storage nodes 250 can be reduced and a leakage current therebetween can be increased.

Referring to FIG. 7B, the storage nodes 250 of FIG. 6 may include a storage node 250a adjacent to the bridges 241 and a storage node 250b adjacent to the openings 242. Since both of inner and outer sidewalls of the storage node 250b are covered with the capacitor dielectric 260 of FIG. 6, an interfacial force exerted on the storage node 250b may be the same at the inner and outer sidewalls. By contrast, since the storage node 250a has an inner sidewall covered with the capacitor dielectric and an outer sidewall locally supported by the bridges 241, there may be a difference in an interfacial force between the inner and outer sidewalls of the storage node 250a. For example, the interfacial force may be more strongly exerted on the outer sidewall of the storage node 250a, and accordingly, the storage node 250a may be bent toward the bridges 241.

According to some example embodiments of the inventive subject matter, the second interval w2 between the storage nodes adjacent to the bridges 241 may be greater than the first interval w1 between the storage nodes adjacent to the openings 242. As exemplarily shown in FIG. 7A, as the result of the bending, the storage nodes 250 may become closer to each other and form the third interval w3 smaller than the second interval w2. Since the second interval w2 is greater than the first interval w1, the storage nodes 250 can be formed to have the third interval w3 capable of limiting leakage current, even when the storage nodes 250 are bent toward the insides of the bridges 221 and 241. For example, the third interval w3 may be substantially equal to the first interval w1.

Figure 8:
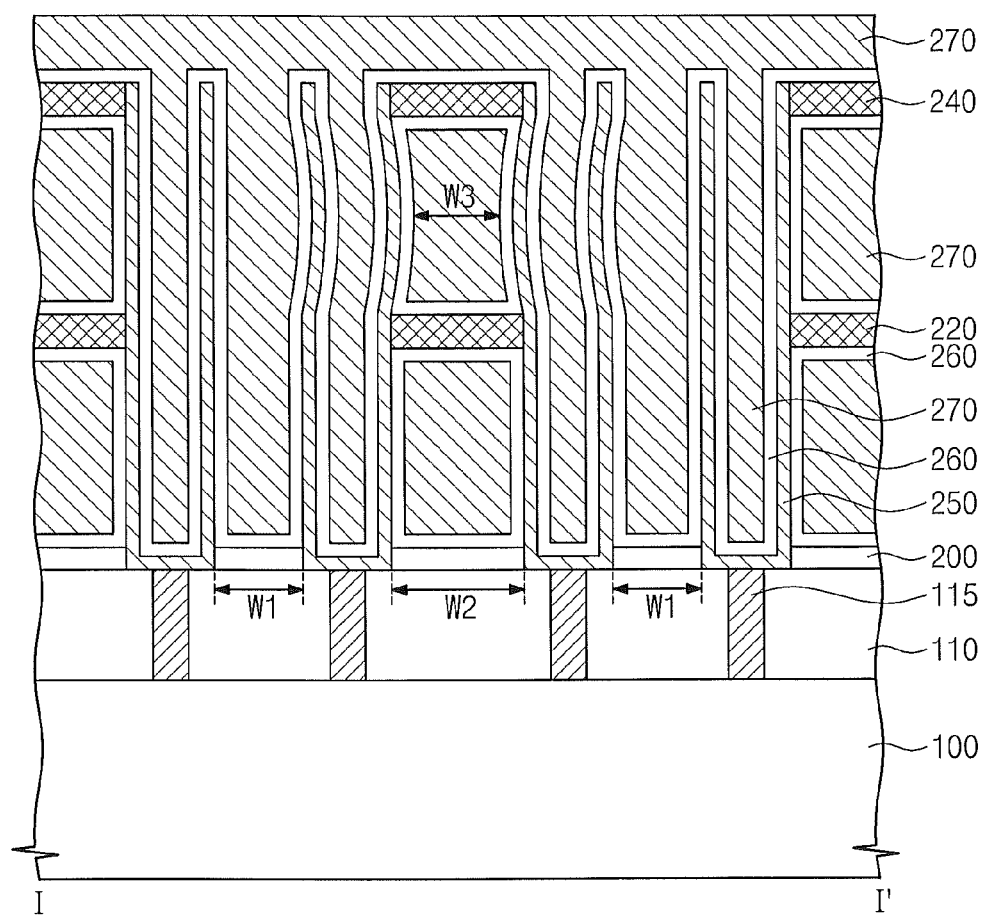

Referring to FIG. 8, an upper electrode layer 270 may be formed on the capacitor dielectric 260. The upper electrode layer 270 may be formed to fill a space that is formed by the removal of the first and second mold layers 210 and 230, and to fill the holes 300. As a result, the capacitor dielectric 260 may be disposed between the upper electrode layer 270 and the storage nodes 250 and between the upper electrode layer 270 and the first and second support patterns 220 and 240. The upper electrode layer 270 may include a doped semiconductor, a conductive metal nitride (e.g., titanium nitride, tantalum nitride, and/or tungsten nitride), a metal (e.g., ruthenium, iridium, titanium, and or tantalum), and/or a conductive metal oxide (e.g., iridium oxide).

According to some example embodiments of the inventive subject matter, the holes 300 and the storage nodes 250 may be provided in such a way that the interval w2 between the storage nodes 250 facing each other with the bridges 221 and 241 interposed therebetween is greater than the interval w1 between the storage nodes 250, which face each other with the openings 222 and 242 of the support patterns 220 and 240 interposed therebetween. Accordingly, even in the case where the storage nodes 250 adjacent to the bridges 221 and 241 are bent toward the insides of the bridges 221 and 241 to have a reduced interval, the storage nodes 250 can have the interval w3 capable of limiting leakage current. That may improve reliability of the semiconductor memory device.

Figure 9A:
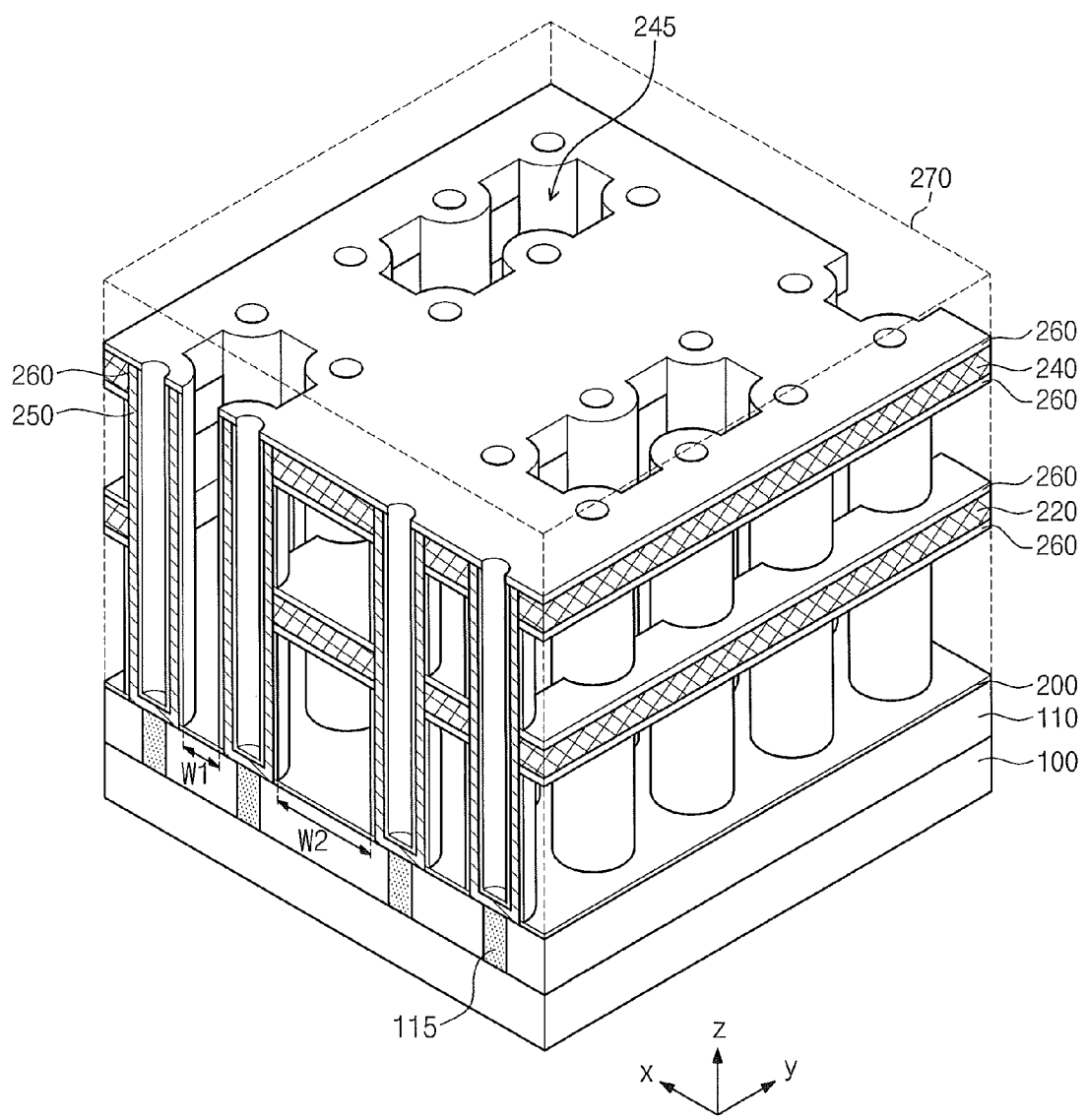
FIG. 9A is a perspective view illustrating a semiconductor memory device according to some example embodiments of the inventive subject matter.
Figure 9B:
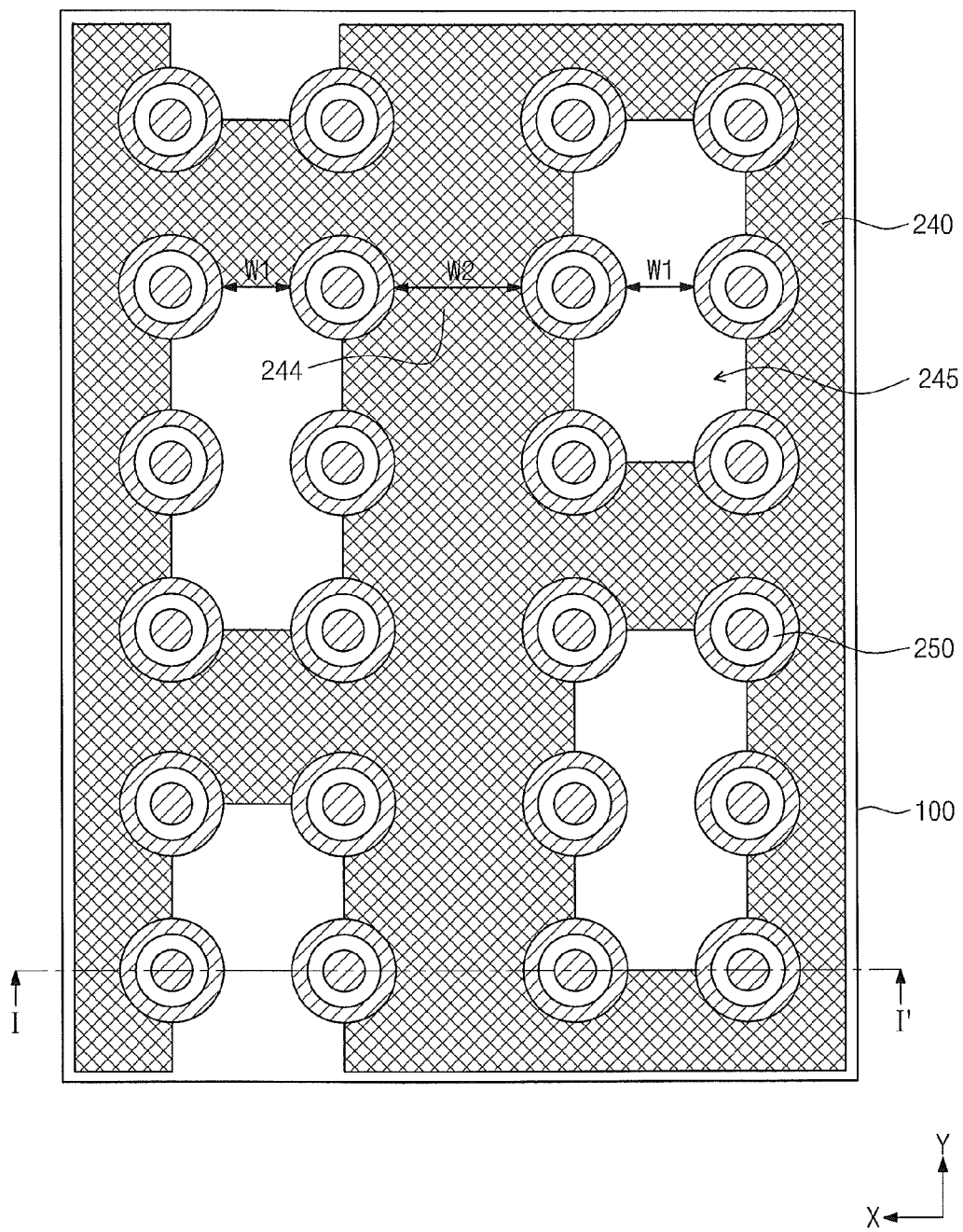
FIG. 9B is a top plan view of FIG. 9A.
Figure 9C:
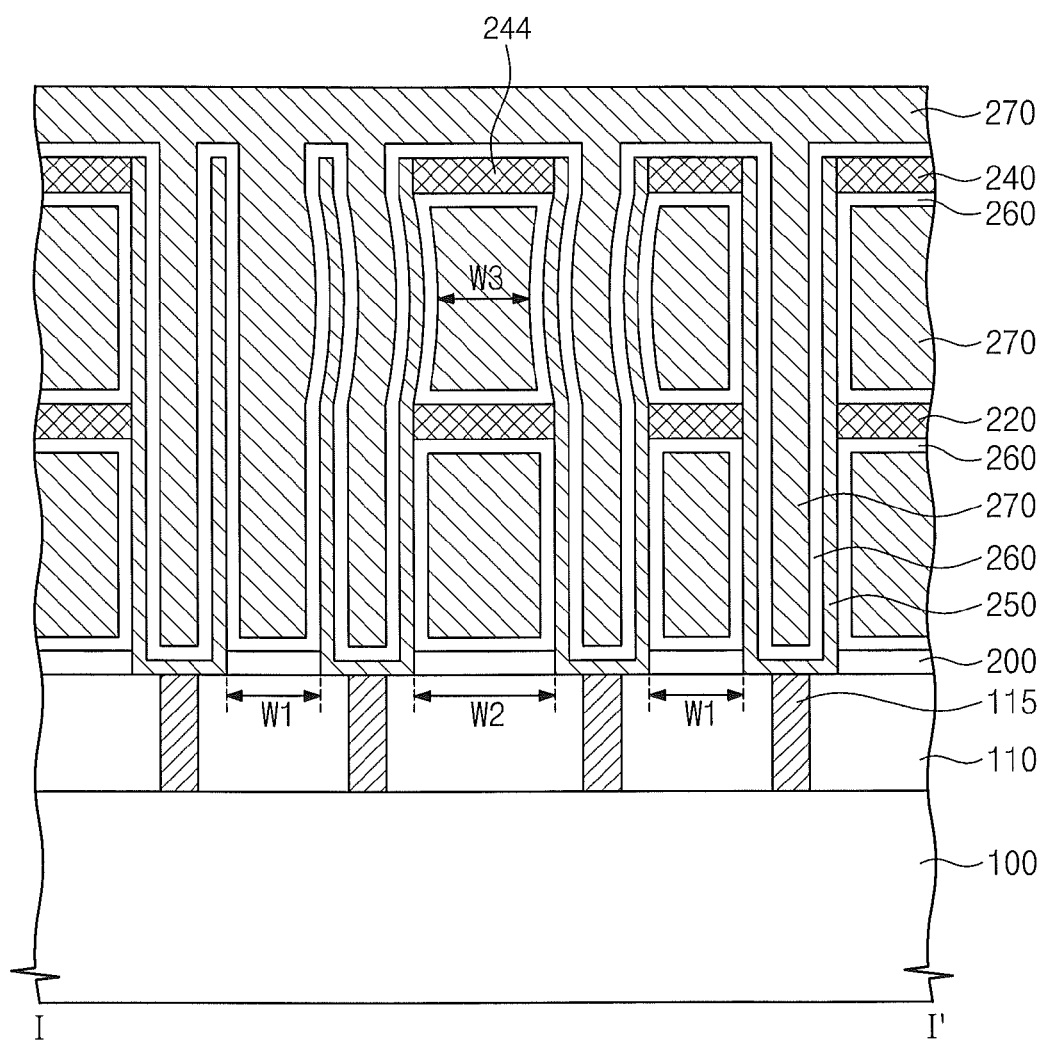
FIG. 9C is a sectional view taken along a line I-I' of FIG. 9B.

FIG. 9A is a perspective view illustrating a semiconductor memory device according to further example embodiments of the inventive subject matter. FIG. 9B is a top plan view of FIG. 9A, and FIG. 9C is a sectional view taken along a line I-I' of FIG. 9B. For the sake of brevity, description of the elements and features of this example that are similar to those previously described with reference to FIGS. 1A through 8 will not be repeated.

Referring to FIGS. 9A through 9C, the interlayer dielectric 110 may be provided on the substrate 100. The contact plugs 115 may be formed on the substrate 100 to penetrate the interlayer dielectric 110. On the interlayer dielectric 110, the storage nodes 250 may have a longitudinal axes perpendicular to the top surface of the substrate 100 (i.e., along z-direction). Respective ones of the storage nodes 250 are electrically connected to corresponding ones of the contact plugs 115. The upper electrode layer 270 may be formed on the interlayer dielectric 110, covering the storage nodes 250.

The first and second support patterns 220 and 240 may be provided on the interlayer dielectric 110. Each of the first and second support patterns 220 and 240 may be in partial contact with sidewalls of the storage nodes 250, thereby supporting the storage nodes 250.

In some example embodiments, as shown in FIG. 9B, the second support pattern 240 may having a plurality of openings 245 defined therein. Each of the openings 245 may expose partially sidewalls of a plurality of the storage nodes 250. In some example embodiments, each of the openings 245 may be formed to expose six, eight or other numbers of lower electrodes 250. For example, in the illustrated embodiments, each of the openings 245 may expose some of the storage nodes 250 disposed in a two-by-three or two-by-four arrangement. For all that, embodiments of the inventive subject are not limited thereto. From plan view, the openings 245 may have a rectangular shape, and the second support pattern 240 may be shaped like a mesh. The first support pattern 220 may be configured in a shape similar to that of the second support pattern 240.

The storage nodes 250 may be arranged spaced apart from each other on the substrate 100 along both x and y directions or two-dimensionally. For a specific column of the storage nodes 250, x directional distances to two other columns adjacent thereto may be different from each other. For example, the second interval w2 between storage nodes 250 separated by a bridge 244 may be greater than the first interval w1 between storage nodes 250 on opposite sides of an opening 245. In other words, the second interval w2 between the storage nodes 250 facing each other at the bridge 244 may be greater than the first interval w1 of the storage nodes 250 facing each other at the openings 242. As shown in FIG. 9C, this may ensure that a third interval W3 between storage nodes 250 separated by a bridge 244 may remain larger than the first interval W1 even if bend by subsequent processing.

The capacitor dielectric 260 may be disposed between the storage nodes 250 and the upper electrode layer 270 and between the first and second support patterns 220 and 240 and the upper electrode layer 270.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

Figure 10:
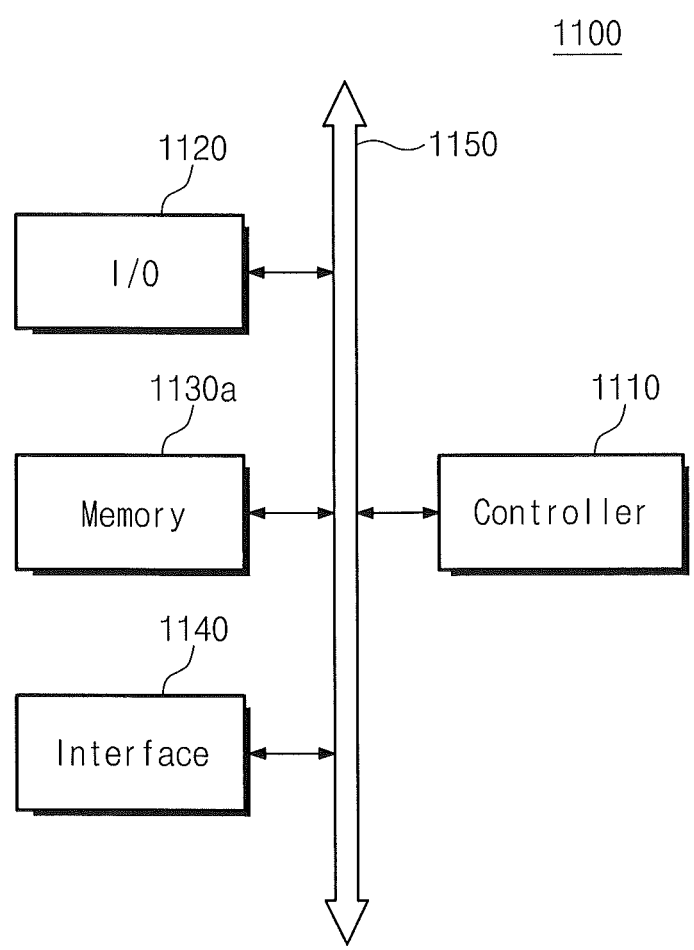
FIG. 10 is a schematic block diagram illustrating an example of an electronic system including a semiconductor memory device according to some example embodiments of the inventive subject matter.

FIG. 10 is a schematic block diagram illustrating an example of an electronic system including a semiconductor memory device according to some example embodiments of the inventive subject matter.

Referring to FIG. 10, an electronic system 1100 according to an embodiment may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include at least one of the semiconductor memory devices according to the embodiments described above. The memory device 1130 may further include other types of semiconductor memory devices that are different from the semiconductor memory devices described above. For example, the memory device 1130 may further include a magnetic memory device, a phase change memory device, a dynamic random access memory (DRAM) device and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data by wireless.

Figure 11:
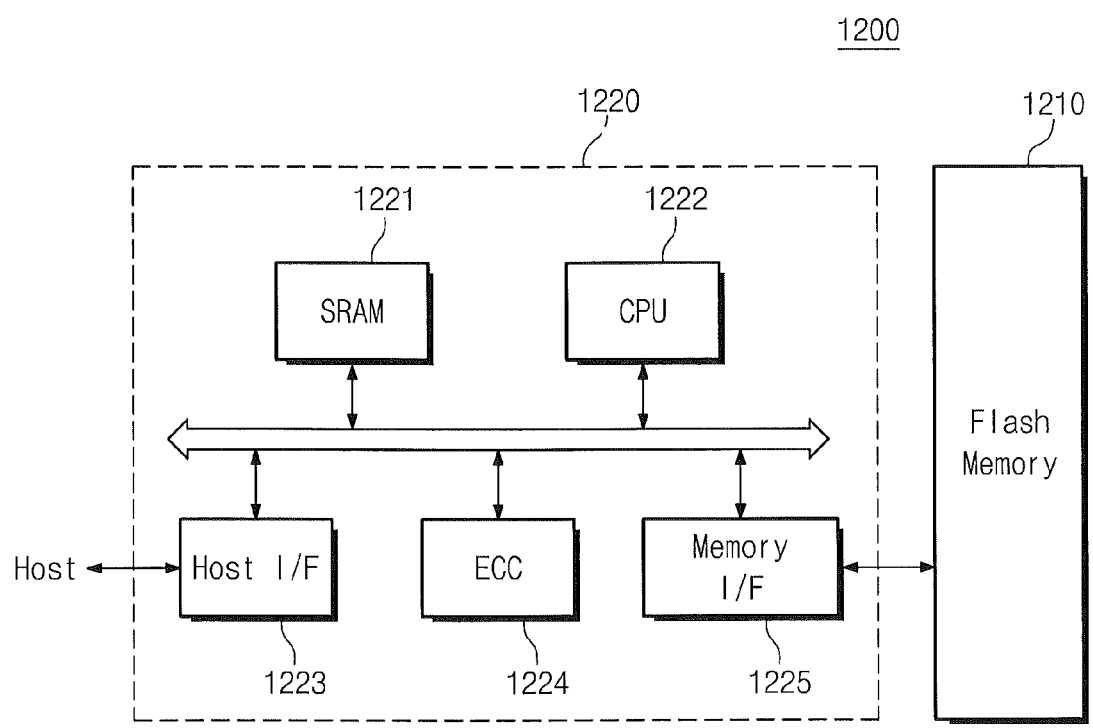
FIG. 11 is a schematic block diagram illustrating an example of a memory card including a semiconductor memory device according to some example embodiments of the inventive subject matter.

FIG. 11 is a schematic block diagram illustrating an example of a memory card including a semiconductor memory device according to the embodiments.

Referring to FIG. 11, a memory card 1200 according to an embodiment may include a memory device 1210. The memory device 1210 may include at least one of the semiconductor memory devices according to the various embodiments mentioned above. In other embodiments, the memory device 1210 may further include another type of semiconductor memory device that is different from the semiconductor memory devices according to the embodiments described above. For example, the memory device 1210 may further include a nonvolatile memory device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though in the drawings, the memory card 1200 may further include a read only memory (ROM) device that stores code data to interface with the host. The memory card 1200 may be used as a portable data storage card. Alternatively, the memory card 1200 may replace hard disks of computer systems as solid state disks (SSD) of the computer systems.

According to some example embodiments of the inventive subject matter, the storage nodes may be provided in such a way that the interval between the storage nodes is greater in the bridge than in the opening. Accordingly, even in the case where the storage nodes adjacent to the bridges are bent toward the insides of the bridges to have a reduced interval, the storage nodes can have an interval capable of preventing a leakage current. This enables to improve reliability of the semiconductor memory device.

While example embodiments of the inventive subject matter have been particularly shown and described, it will be understood by one of ordinary skill in the art that variations in form and detail may be made therein without departing from the spirit and scope of the attached claims.

What is claimed is:

1. A memory device, comprising:
   a substrate;
   a plurality of vertical storage nodes on the substrate and arranged in at least one row along a first axis, each of the at least one row including a first repeating pair of adjacent storage nodes separated from one another by a first distance and a second repeating pair of adjacent storage nodes separated from one another by a second distance wherein the first distance is greater than the second distance;

and at least one support pattern abutting sidewalls of the storage nodes, the at least one support pattern having a portion that bridges between the storage nodes of the first repeating pair of adjacent storage nodes and having an opening therein separating the storage nodes of the second repeating pair of adjacent storage nodes.

2. The device of claim 1, wherein the at least one row comprises a plurality of rows, each extending along the first axis and spaced apart along a second as transverse to the first as and wherein the at least one support pattern comprises a plurality of parallel elongate strips extending along the second axis.

3. The device of claim 1, wherein the at least one row comprises a plurality of rows, each extending along the first axis and spaced apart along a second axis transverse to the first axis, wherein the at least one support pattern comprises a mesh, and wherein the openings comprise openings spaced apart along the second axis.

4. The device of claim 1, wherein the at least one support pattern comprises a first support pattern positioned at a first height above the substrate and a second support pattern positioned at a second height above the substrate.

5. The device of claim 4, wherein a top surface of the second support pattern is coplanar with top surfaces of the storage nodes.

6. The device of claim 1, further comprising:
a capacitor dielectric surrounding the storage nodes; and
an electrode layer covering the storage nodes and the capacitor dielectric.

7. The device of claim 1, wherein the storage nodes are cylindrical.

8. The device of claim 1, further comprising an etch stop layer on the substrate and having a bottom surface that is coplanar with bottom surfaces of the storage nodes.

9. A memory device, comprising:
a substrate;
a plurality of vertical capacitors on the substrate and arranged in at least one row along a first axis, each of the at least one row including a first repeating pair of adjacent vertical capacitors separated from one another by a first distance and a second repeating pair of adjacent vertical capacitors separated from one another by a second distance wherein the first distance is greater than the second distance; and
at least one support pattern abutting sidewalls of the vertical capacitors, the at least one support pattern having a portion that bridges between the vertical capacitors of the first repeating pair of adjacent vertical capacitors and having an opening therein separating the vertical capacitors of the second repeating pair of adjacent vertical capacitors.

10. The device of claim 9, wherein each of the vertical capacitors comprises:
a cup-shaped lower electrode having a base portion and wall portions that define an inner volume;
a dielectric layer conforming to an inner wall of the lower electrode; and
an upper electrode extending into the inner volume defined by the lower electrode and separated by the lower electrode by the dielectric layer.

11. The device of claim 10, wherein the at least one support pattern abuts outer walls of the lower electrodes.

12. The device of claim 9, wherein the at least one support pattern comprises a plurality of support patterns spaced apart along a vertical dimension of the vertical capacitors.

13. The device of claim 9, wherein the at least one support pattern comprises a plurality of parallel elongate strips extending along a second as transverse to the first axis.

14. The device of claim 9, wherein the at least one support pattern comprises a mesh, and wherein the openings comprise openings spaced apart along a second axis transverse to the first axis.

15. The device of claim 1, wherein the plurality of vertical storage nodes is also arranged in at least one column along a second axis transverse to the first axis.

16. The device of claim 9, wherein the plurality of vertical capacitors is also arranged in at least one column along a second axis transverse to the first axis.

* * * * *